(12) United States Patent
Cho et al.

(10) Patent No.: US 7,546,002 B2
(45) Date of Patent: Jun. 9, 2009

(54) PRINTED CIRCUIT BOARD AND MANUFACTURING METHOD THEREOF

(75) Inventors: Han Seo Cho, Daejeon (KR); Je-Gwang Yoo, Yongin-si (KR); Sang-Hoon Kim, Gunpo-si (KR); Joon-Sung Kim, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 17 days.

(21) Appl. No.: 11/889,477

(22) Filed: Aug. 14, 2007

(65) Prior Publication Data

US 2008/0044129 A1    Feb. 21, 2008

(30) Foreign Application Priority Data

Aug. 21, 2006    (KR) ...................... 10-2006-0079003

(51) Int. Cl.
*G02B 6/12*    (2006.01)
*G02B 6/10*    (2006.01)

(52) U.S. Cl. .......................... 385/14; 385/129; 385/130; 385/132

(58) Field of Classification Search .................. 385/14, 385/129–132
See application file for complete search history.

(56) References Cited

U.S. PATENT DOCUMENTS 6,259,840 B1 *    7/2001    Munoz-Bustamante et al. .. 385/39

* cited by examiner

*Primary Examiner*—Frank G Font
*Assistant Examiner*—Michael P Mooney

(57) ABSTRACT

A printed circuit board and a method of manufacturing a printed circuit board are disclosed. A printed circuit board in which optical waveguides are formed for transmitting optical signals together with electrical signals, which includes a cladding, a core embedded in the cladding that transmits optical signals, and a wiring pattern embedded in the cladding that transmits electrical signals, can offer improved optical connection efficiency and reduced material costs by enabling the cladding to act as an insulation layer and embedding the wiring pattern in the cladding.

3 Claims, 10 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2006-0079003 filed with the Korean Intellectual Property Office on Aug. 21, 2006, the disclosure of which is incorporated herein by reference in its entirety.

BACKGROUND

1. Technical Field

The present invention relates to a printed circuit board and a method of manufacturing a printed circuit board.

2. Description of the Related Art

With the higher capacities and higher speeds of data used in electronic components, the technology of printed circuit boards using copper-based electrical wiring is reaching a limit. In this context, the printed circuit board including optical wiring is gaining attention as a technology to overcome problems of the conventional copper-based electrical wiring.

A printed circuit that includes optical wiring has an optical waveguide inserted, which is able to exchange signals with light using polymers or optical fibers, and is referred to as an EOCB (electro-optical circuit board). Applications using the EOCB include switches and transmission/receiver equipment in a communication network, switches and servers in data communication, communications in aerospace and avionics engineering, mobile phone stations in a UMTS (Universal Mobile Telecommunication System), and backplanes and daughter boards in a supercomputer, etc.

FIGS. 1a to 1c illustrate a method of forming optical fibers in a printed circuit board for use in optical wiring, and FIGS. 2a to 2b illustrate a method of forming polymer optical waveguides in a printed circuit board.

FIG. 1a is a plan view illustrating alignment grooves formed in one side of a printed circuit board for aligning optical fibers, and FIG. 1b is a cross-sectional view across line A-A of FIG. 1a. FIG. 1c is a cross-sectional view illustrating a conventional cladding including optical fibers in a printed circuit board. In the case of optical wiring using optical fibers, a separate optical fiber cladding 15 is additionally included, and optical fibers 15c are disposed and arranged in alignment grooves 15a precision-processed in one side of the optical fiber cladding 15. The alignment grooves 15a are formed by copper etching, or laser or mechanical processing. As illustrated in FIG. 1c, an insulation layer 13 and copper wiring layer 19 are stacked on the upper side of the optical fiber cladding 15 by a pressing process.

FIG. 2a is a cross-sectional view of a conventional cladding having polymer optical waveguides, FIG. 2b is a cross-sectional view of a conventional cladding having polymer optical waveguides stacked in a printed circuit board. Referring to FIG. 2a, a conventional polymer cladding 17 includes an undercladding 17b, a core 17c formed by pressing on the undercladding 17b with a silicon master (not shown), and an overcladding 17a coupled to the upper side of the undercladding 17b to seal the core 17c. As illustrated in FIG. 2b, an insulation layer 13 and copper wiring layer 19 are stacked on the upper side of the polymer cladding 17 by a pressing process.

As discussed above, since the method of forming conventional optical waveguides requires an additional optical fiber cladding 15 or a polymer cladding 17, the overall thickness of the printed circuit board may be increased. In particular, when the optical wiring is not required in a large amount, an increase in thickness due to the addition of cladding may be inefficient. Also, not only may the additional cladding cause an increase in manufacturing costs, but also the manufacturing process may be made more complicated because of the additional stacking of the cladding.

SUMMARY

An aspect of the invention is to provide a printed circuit board and a manufacturing method thereof which offer improved optical connection efficiency and reduced material costs by enabling the cladding to act as an insulation layer and embedding the wiring pattern in the cladding.

One aspect of the claimed invention provides a printed circuit board in which optical waveguides are formed for transmitting optical signals together with electrical signals. The printed circuit board may include a cladding, a core embedded in the cladding that transmits optical signals, and a wiring pattern embedded in the cladding that transmits electrical signals.

At least of a portion of one side of the wiring pattern may be exposed to the exterior of the printed circuit board, for example to be electrically connected with optical elements, etc.

The cladding may include a first cladding, in which the core is embedded, and a second cladding, in which the wiring pattern is embedded.

Another aspect of the claimed invention provides a method of manufacturing a printed circuit board, which includes forming a wiring pattern on one side of a carrier part, stacking a first cladding on the side of the carrier part on which the wiring pattern is formed, forming a core on the opposite side of the first cladding on which the wiring pattern is formed, stacking a second cladding on the side of the first cladding on which the core is formed, and removing the carrier part such that one side of the wiring pattern is exposed.

An operation of forming solder resist on the side on which the wiring pattern is formed may additionally be performed.

Also, the carrier part may include a carrier layer and an etching resistant layer, where forming the wiring pattern may be performed by forming a wiring pattern on the other side of the etching resistant layer.

Additional aspects and advantages of the claimed invention will be set forth in part in the description which follows, and in part will be obvious from the description, or may be learned by practice of the invention.

BRIEF DESCRIPTION OF THE DRAWINGS

FIG. 1b is a cross-sectional view across line A-A of FIG. 1a.

DETAILED DESCRIPTION

A printed circuit board and a method of manufacturing the printed circuit board according to certain embodiments of the invention will be described below in more detail with reference to the accompanying drawings, in which those components are rendered the same reference number that are the same or are in correspondence, regardless of the figure number, and redundant explanations are omitted.

First, a printed circuit board according to a first disclosed embodiment of the invention will be described with reference to FIGS. 3 and 4.

In a printed circuit board according to this embodiment, the insulation layer of the printed circuit board may be replaced by a cladding having cores formed therein, with a wiring pattern embedded in the cladding.

Figure 1A:
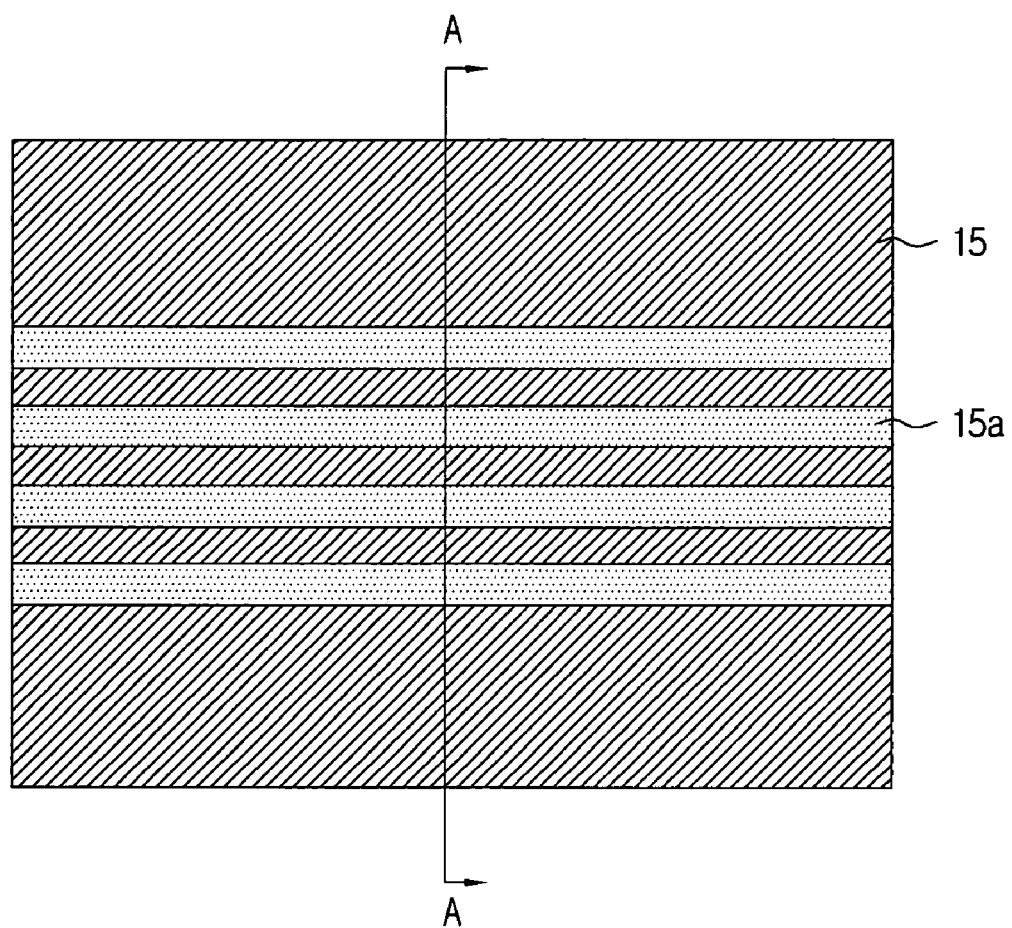
FIG. 1a is a plan view of a cladding illustrating optical fibers inserted and disposed in alignment grooves in the surface of a conventional board.
Figure 1B:
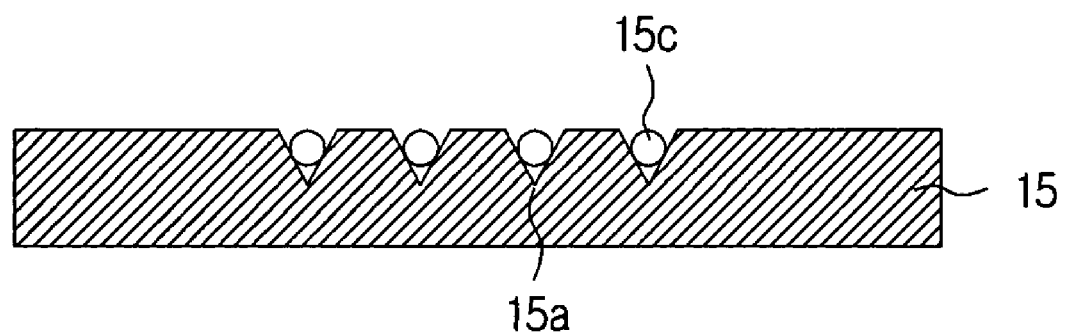
Figure 1C:
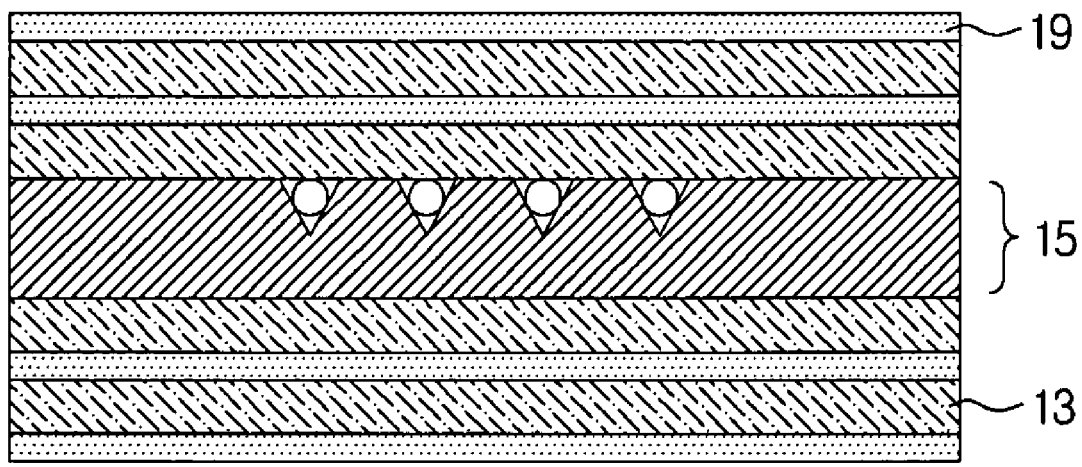
FIG. 1c is a cross-sectional view illustrating a conventional cladding including optical fibers in a printed circuit board.
Figure 2A:
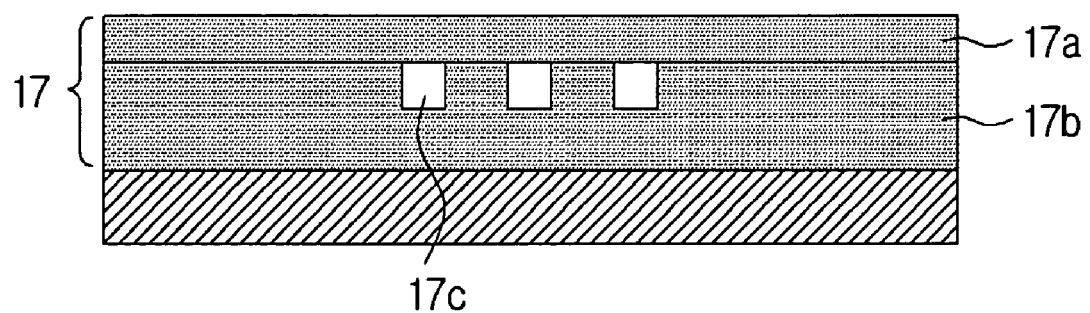
FIG. 2a is a cross-sectional view of a conventional cladding having polymer optical waveguides.
Figure 2B:
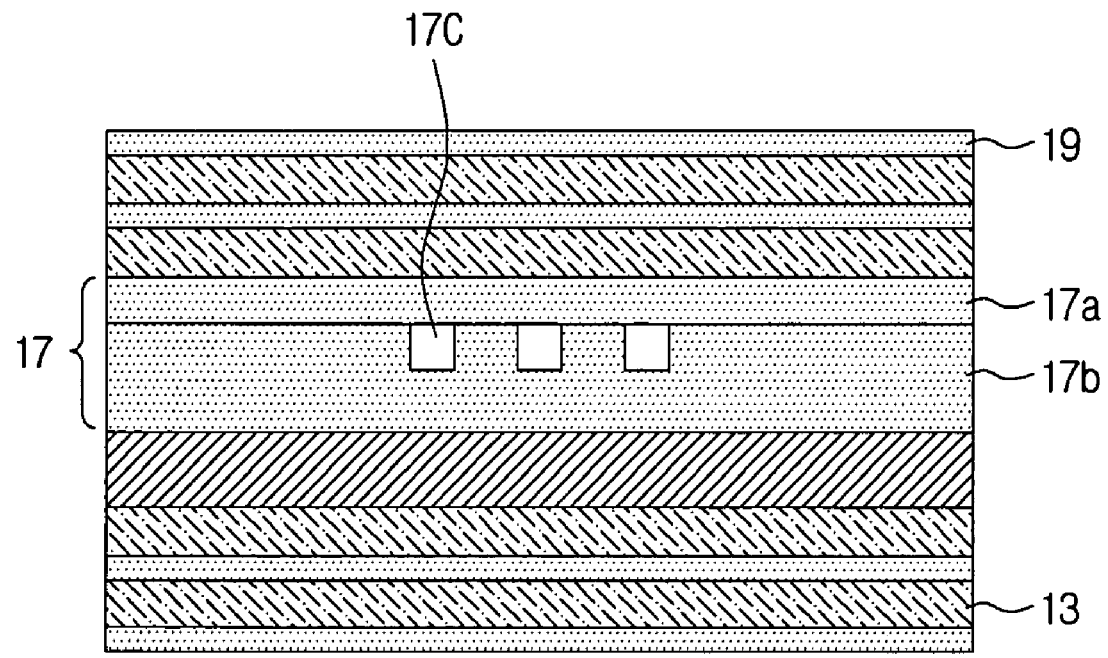
FIG. 2b is a cross-sectional view of a conventional cladding having polymer optical waveguides, stacked in a printed circuit board.
Figure 3:
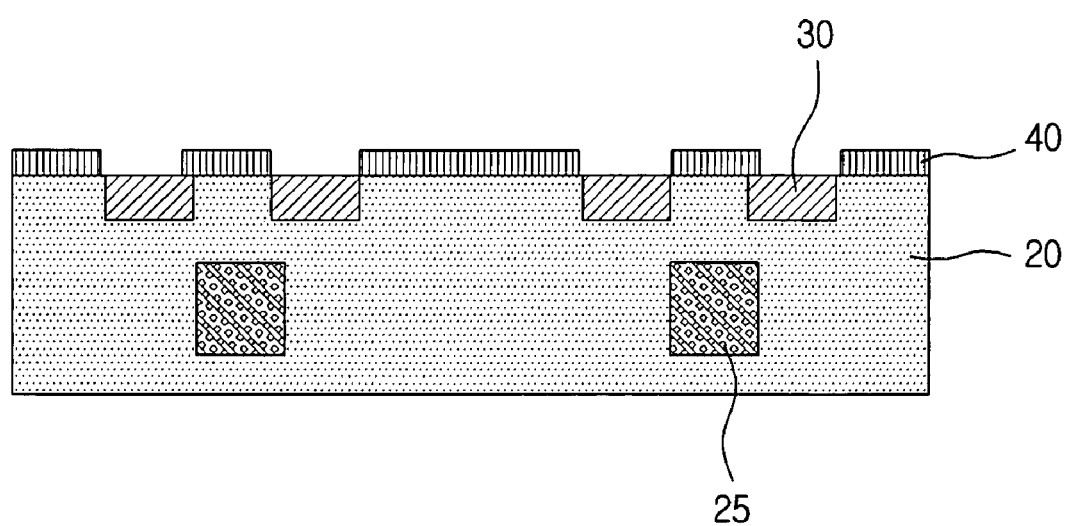
FIG. 3 is a cross-sectional view illustrating the structure of a printed circuit board according to a first disclosed embodiment of the claimed invention.
Figure 4:
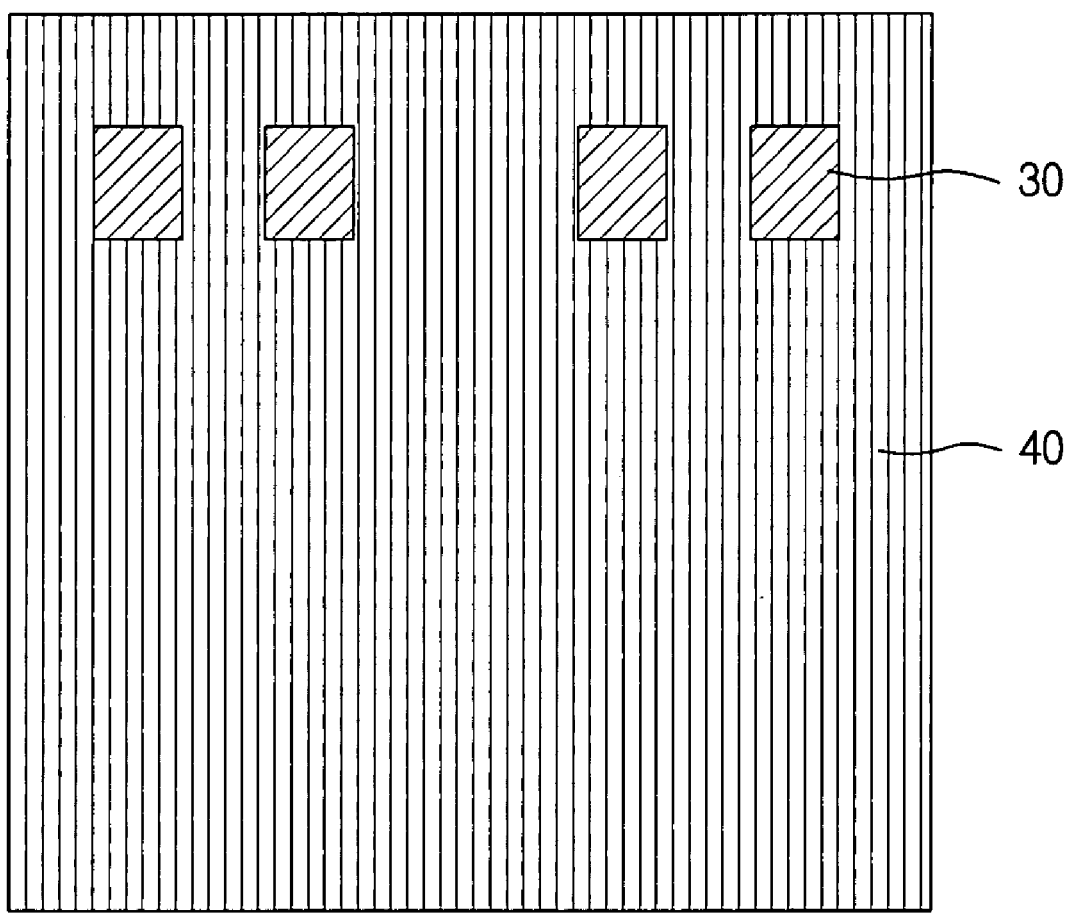
FIG. 4 is a plan view of the printed circuit board illustrated in FIG. 3.

FIG. 3 is a cross-sectional view illustrating the structure of a printed circuit board according to a first disclosed embodiment of the claimed invention, and FIG. 4 is a plan view of the printed circuit board illustrated in FIG. 3. In FIGS. 3 and 4 are illustrated a cladding 20, cores 25, a wiring pattern 30, and solder resist 40.

The cladding 20 surrounds the cores, which will be described later, and allows efficient transmission of optical signals, while acting as the insulation layer in a typical printed circuit board with regards the wiring pattern 30, also to be described later. The cladding 20 may be made of a polymer material. The wiring pattern 30 and cores 25 may be embedded in the cladding 20, which will be described later.

The wiring pattern 30 allows the transmission of electrical signals in the printed circuit board, and may be made of a metal such as copper (Cu), which is high in electrical conductivity. The wiring pattern 30 may be embedded in the cladding 20, and may be formed to have one side exposed to the exterior of the printed circuit board according to this embodiment. When one side is not exposed to the exterior of the printed circuit board, a device such as a VCSEL 50 may have to be embedded in the printed circuit board, but by having one side of the wiring pattern 30 exposed to the exterior, a device such as a VCSEL 50 need not be embedded in the printed circuit board.

The wiring pattern 30 may be embedded in the cladding 20 by a method of forming the wiring pattern 30 on a separate carrier layer 80, stacking and pressing the cladding 20 onto the carrier layer 80, and then removing the carrier layer 80. Of course, the wiring pattern 30 may be embedded in the cladding 20 by various methods other than that described above.

In the printed circuit board, the cores 25 may serve as paths through which optical signals are transferred, and may be embedded n and surrounded by the cladding 20. Similar to the cladding 20, the cores 25 may also be made of a polymer material, but may have a refractive index higher than that of the cladding 20, for efficient transmission of optical signals.

In order that the cores 25 and wiring pattern 30 may readily be embedded in the cladding 20, the cladding 20 may be composed of a first cladding 21, in which the cores 25 are embedded, and a second cladding 22, in which the wiring pattern 30 is embedded.

To be more specific, after forming the wiring pattern 30 on the carrier layer 80, the second cladding 22 may be stacked and pressed onto the carrier layer 80 such that the wiring pattern 30 may be embedded in the second cladding 22, and after forming cores on the upper side of the second cladding 22 in which the wiring pattern 30 is embedded, the first cladding 21 may be stacked and pressed onto the second cladding 22, so that the cores 25 may be embedded in the first cladding 21, while both the cores 25 and the wiring pattern 30 may be embedded in the cladding 20.

Besides this, the cores 25 and the wiring pattern 30 may both be embedded in the cladding 20 by having the cores 25 embedded in the first cladding 21, and the wiring pattern 30 embedded in the second cladding 22, and then stacking the first cladding 21 and second cladding 22, having the cores 25 and wiring pattern 30 embedded, respectively.

The solder resist 40 may be a coated film that prevents unwanted connections caused by soldering, etc., while mounting a component, and may be formed on one side of the cladding 20. The solder resist 40 may also act as a protective material for the wiring pattern 30 on the surface of the printed circuit board, and may generally be applied in the form of a liquid.

The solder resist 40 may be applied by stacking a solder resist film 41 and then etching the film. However, it is apparent that the solder resist 40 may be applied by various other methods, such as screen-printing, roller coating, curtain coating, and spray coating.

Figure 5:
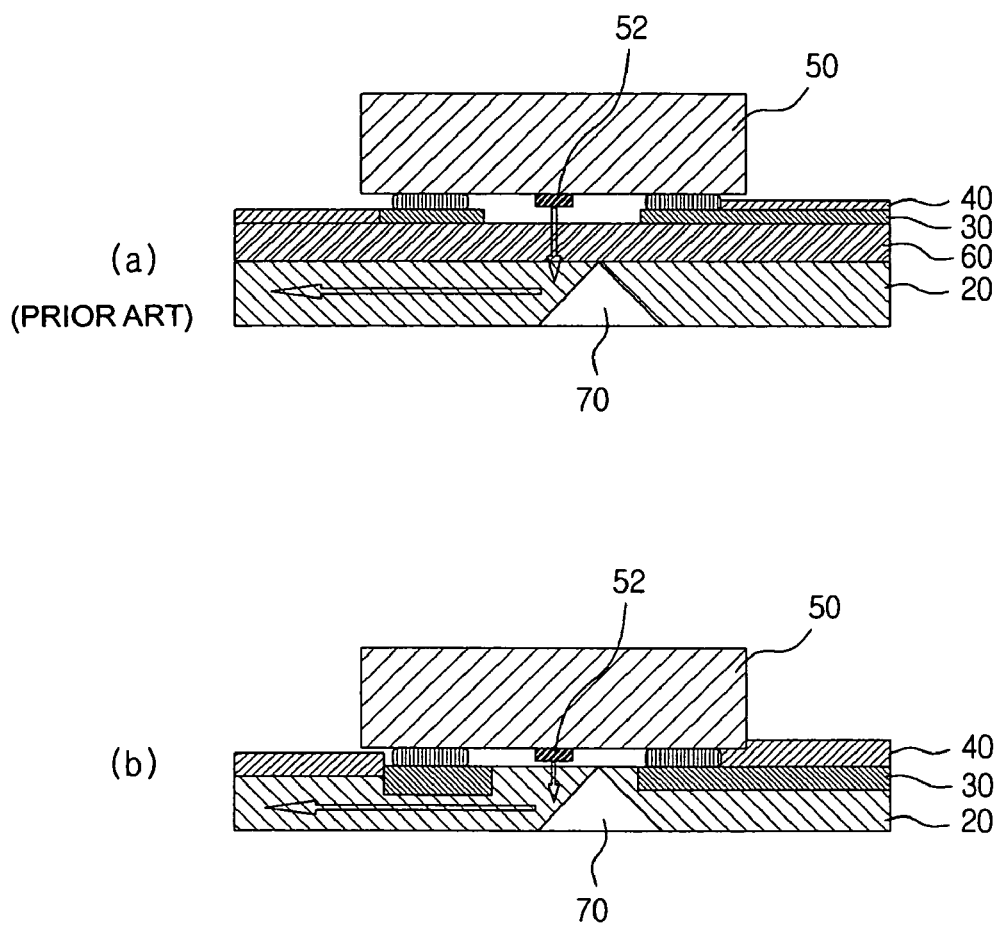
FIG. 5 is a cross-sectional view comparing a printed circuit board according to prior art and the printed circuit board illustrated in FIG. 3.

FIG. 5 is a cross-sectional view comparing a printed circuit board according to prior art and the printed circuit board illustrated in FIG. 3. In FIG. 5 are illustrated claddings 20, wiring patterns 30, solder resist 40, VCSEL's 50, diodes 52, insulation layers 60, and mirrors 70.

Drawing (a) of FIG. 5 is a cross-sectional view illustrating a printed circuit board according to prior art, and drawing (b) is a cross-sectional view illustrating the printed circuit board shown in FIG. 3. The arrows in drawings (a) and (b) represent the paths of optical signals.

As described above, in the printed circuit board shown in FIG. 3, the thickness may be reduced by having the cladding 20 replace the insulation layer 60, so that the distance from the diode 52 of the VCSEL 50 to the mirror 70 may be reduced.

In order for the optical signals to be transmitted through the cores 25, i.e. optical waveguides, the optical signals transmitted from the diode 52 may be reflected by a mirror 70 to be provided in a lengthwise direction of the optical waveguides. However, during the course of the optical signals reaching the mirror 70 from the diode 52, there is a risk of errors occurring, due to the divergence angle. To resolve such a risk, it may be desirable to shorten the path from the diode 52 to the mirror 70, and in the printed circuit board according to this embodiment, the path from the diode 52 to the mirror 70 may be shortened by replacing the insulation layer with the cladding 20.

Next, a method of manufacturing a printed circuit board according to a second disclosed embodiment of the invention will be described below with reference to FIGS. 6 and 7.

Figure 6:
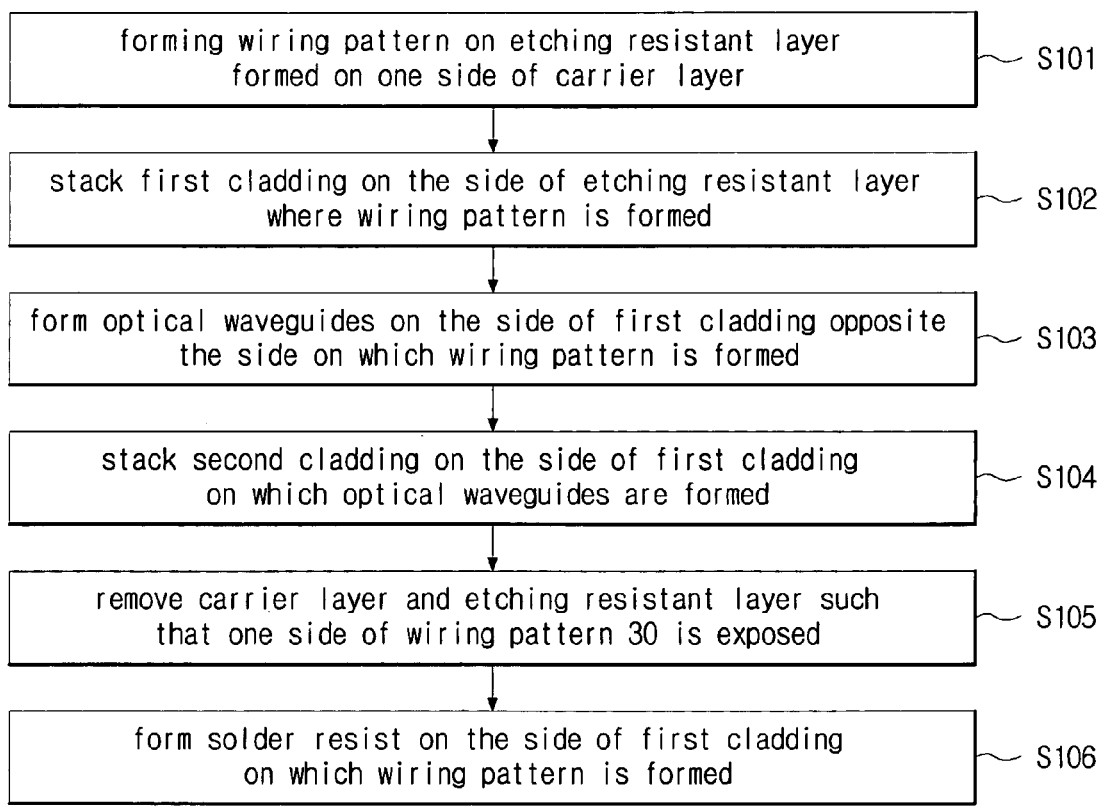
FIG. 6 is a flowchart illustrating a method of manufacturing a printed circuit board according to a second disclosed embodiment of the claimed invention.
Figure 7:
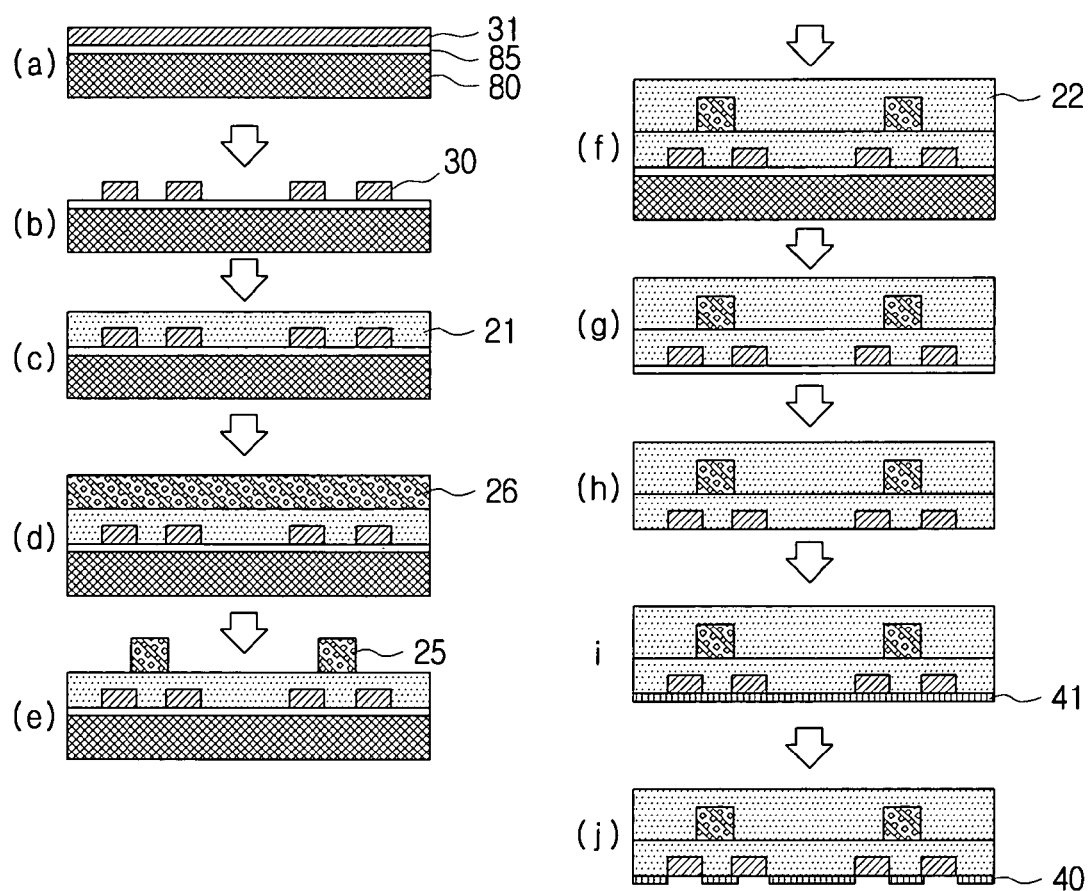
FIG. 7 is a flow diagram illustrating the method of manufacturing a printed circuit board illustrated in FIG. 6.

FIG. 6 is a flowchart illustrating a method of manufacturing a printed circuit board according to a second disclosed embodiment of the claimed invention, and FIG. 7 is a flow diagram illustrating the method of manufacturing a printed circuit board illustrated in FIG. 6. In FIG. 7 are illustrated a first cladding 21, a second cladding 22, a core layer 26, cores 25, a wiring pattern 30, a metal layer 31, a solder resist film 41, solder resist 40, a carrier layer 80, and an etching resistant layer 85.

Operation s101 is of forming the wiring pattern 30 on the etching resistant layer 85 formed on one side of the carrier layer 80. The wiring pattern 30 may serve to transmit electrical signals, and the specific structure of the wiring pattern 30 may vary according to its design.

The etching resistant layer 85 may serve to prevent the carrier layer 80 from being etched during the process of etching the metal layer 31, and the carrier layer 80 may act as a medium by which to move the wiring pattern 30, formed by etching the metal layer 31, onto the cladding 20, to be described later.

In this embodiment, a subtractive method, which uses etching, may be used to form the wiring pattern 30 on the etching resistant layer 85. That is, a metal layer 31 may be stacked on the etching resistant layer 85, and exposure and etching procedures may be performed, to form the wiring pattern 30. An example of this process is shown in drawings (a) and (b) of FIG. 7.

The etching resistant layer 85 may serve to prevent the carrier layer 80 from being exposed to and etched by the etchant, and thus the carrier layer 80 may be reutilized.

While a subtractive method using etching is presented in this embodiment as a method of forming the wiring pattern 30, the wiring pattern 30 may just as well be formed by additive methods, such as those that use inkjet printing or plating.

However, when forming the wiring pattern 30 by an additive method that uses inkjet printing or plating, the etching resistant layer 85 described with respect to this embodiment may not be required, and thus the wiring pattern 30 may be formed directly on the first cladding 21.

Operation s102 is of stacking the first cladding 21 on the side of the etching resistant layer 85 where the wiring pattern 30 is formed. When the first cladding 21 is stacked on the side where the wiring pattern 30 is formed and then pressed, the wiring pattern 30 may become embedded in the first cladding 21. The first cladding 21 may be a polymer substance, and may function as the insulation layer in a printed circuit board according to prior art. An example of this process is shown in (c) of FIG. 7.

Operation s103 is of forming optical waveguides on the side of the first cladding 21 opposite the side on which the wiring pattern 30 is formed. The optical waveguides serve to transfer the optical signals. In this embodiment, the cores 25 made of polymer substances are presented as examples of optical waveguides.

In order to form the optical waveguides on the side of the first cladding 21 opposite the side on which the wiring pattern 30 is formed, a core layer 26 made of a polymer substance may first be stacked. Then, by performing exposure and etching, the cores 25 may be formed. An example of this process is shown in drawings (d) and (e) of FIG. 7.

While the method of stacking a core layer 26 and etching is presented as a method of forming the cores 25 in manufacturing a printed circuit board according to this embodiment, it is apparent that other methods may also be used, such as imprinting, screen-printing, and laser processing, etc.

Operation s104 is of stacking the second cladding 22 on the side of the first cladding 21 on which the optical waveguides are formed. In this way, the optical waveguides, i.e. the cores 25, are embedded in the second cladding 22. The second cladding 22, similar to the first cladding 21, may be of a polymer substance, and may be the same substance as that of the first cladding 21. The second cladding 22 may function as a cladding which surrounds the optical waveguides, while functioning also as the insulation layer of a printed circuit board according to prior art with regards the wiring pattern 30 described above. The same may be true for the first cladding 21. An example of this process is shown in drawing (f) of FIG. 7.

Operation s105 is of removing the carrier layer 80 and etching resistant layer 85 such that one side of the wiring pattern 30 is exposed. As described above, the etching resistant layer 85 may serve to prevent the carrier layer 80 from being etched when the metal layer 31 is etched, while the carrier layer 80 may be used for moving the wiring pattern 30, formed by, etching the metal layer 31, to the cladding.

Thus, after forming the wiring pattern 30 by etching the metal layer 31, and moving the wiring pattern 30 thus formed onto the cladding, such as by the operations s101 through s104 described above, the carrier layer 80 and etching resistant layer 85 may be removed, to complete the printed circuit board.

By removing the carrier layer 80 and etching resistant layer 85 as such, one side of the wiring pattern 30 embedded in the cladding may be exposed to the exterior. By use of the exposed wiring pattern 30, various components may be mounted on the printed circuit board. An example of this process is shown in drawings (g) and (h) of FIG. 7.

If the wiring pattern 30 is formed by an additive method using inkjet printing or plating, the etching resistant layer 85 may not have been used, in which case, one side of the wiring pattern 30 may be exposed to the exterior of the printed circuit board by removing only the carrier layer 80.

Operation s106 is of forming solder resist 40 on the side of the first cladding 21 on which the wiring pattern 30 is formed. The solder resist 40 may be a coating which prevents undesired connections that may be created due to soldering while mounting components. The solder resist 40 may also act as a protective material for the wiring pattern 30 on the surface of the printed circuit board, and may generally be applied in the form of a liquid.

To form the solder resist 40, a method may be used of stacking a solder resist film 41 and then etching the solder resist film 41. An example of this process is shown in drawings (i) and (j) of FIG. 7.

However, it is apparent that the solder resist 40 may be applied by various other methods, such as screen-printing, roller coating, curtain coating, and spray coating.

According to at least one aspect of the claimed invention as set forth above, a printed circuit board and a method of manufacturing the printed circuit board may be provided, which offer improved optical connection efficiency and reduced material costs by enabling the cladding to act as an insulation layer and embedding the wiring pattern in the cladding.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A printed circuit board having an optical waveguide formed therein for transmitting optical signals together with electrical signals, the printed circuit board comprising:
    a cladding;
    a core embedded in the cladding and configured to transmit optical signals;
    a wiring pattern embedded in the cladding such that at least a portion of one side of the wiring pattern is exposed to the exterior of the cladding, and configured to transmit electrical signals; and
    an optoelectric device mounted on the cladding and connected to the wiring pattern.

2. The printed circuit board of claim 1, wherein the cladding comprises:
    a first cladding having the core embedded therein; and
    a second cladding made of the same material as that of the first cladding and having the wiring pattern embedded therein.

3. The printed circuit board of claim 1, wherein the cladding and the core are made of polymer materials.

* * * * *